United States Patent
Chen et al.

(10) Patent No.: US 7,969,016 B2
(45) Date of Patent: Jun. 28, 2011

(54) SELF-ALIGNED WAFER OR CHIP STRUCTURE, AND SELF-ALIGNED STACKED STRUCTURE

(75) Inventors: Jung-Tai Chen, Kaohsiung County (TW); Tzong-Che Ho, Hsinchu (TW); Chun-Hsun Chu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 472 days.

(21) Appl. No.: 11/946,814

(22) Filed: Nov. 28, 2007

(65) Prior Publication Data
US 2008/0315433 A1    Dec. 25, 2008

(30) Foreign Application Priority Data
Jun. 22, 2007  (TW) ................. 96122443 A (51) Int. Cl.
*H01L 23/48* (2006.01)
(52) U.S. Cl. .................. 257/777; 257/738; 257/780
(58) Field of Classification Search .................. 257/777, 257/738, 737, 780
See application file for complete search history.

(56) References Cited

U.S. PATENT DOCUMENTS

| | | | |
|---|---|---|---|
| 5,229,647 A | 7/1993 | Gnadinger | |
| 5,329,423 A | 7/1994 | Scholz | |
| 6,621,164 B2 * | 9/2003 | Hwang et al. | 257/738 |
| 6,936,913 B2 | 8/2005 | Akerling et al. | |
| 6,998,344 B2 * | 2/2006 | Akram et al. | 438/667 |
| 7,091,124 B2 | 8/2006 | Rigg et al. | |
| 2004/0113264 A1 | 6/2004 | Akerling et al. | |

FOREIGN PATENT DOCUMENTS

| | | |
|---|---|---|
| JP | 04-328857 | 11/1992 |
| JP | 2003-318178 | 11/2003 |
| JP | 2004-200547 | 7/2004 |
| WO | 0055898 | 9/2000 |

OTHER PUBLICATIONS

"1st Office Action of China counterpart application", issued on May 22, 2009, p. 1-p. 7.
"Office Action of Japan Counterpart Application" issued on Aug. 24, 2010, p. 1-p. 3, in which the listed references were cited.

* cited by examiner

*Primary Examiner* — Leonardo Andújar
(74) *Attorney, Agent, or Firm* — Jianq Chyun IP Office (57) ABSTRACT

A self-aligned wafer or chip structure including a substrate, at least one first concave base, at least one second concave base, at least one connecting structure and at least one bump is provided. The substrate has a first surface and a second surface, and at least one pad is formed on the first surface. The first concave base is disposed on the first surface and electrically connected to the pad. The second concave base is disposed on the second surface. The connecting structure passes through the substrate and disposed between the first and second concave bases so as to be electrically connected to the first and second concave bases. The bump is filled in the second concave base and protrudes out of the second surface.

15 Claims, 12 Drawing Sheets

SELF-ALIGNED WAFER OR CHIP STRUCTURE, AND SELF-ALIGNED STACKED STRUCTURE

CROSS-REFERENCE TO RELATED APPLICATION

This application claims the priority benefit of Taiwan application serial no. 96122443, filed on Jun. 22, 2007. The entirety of the above-mentioned patent application is hereby incorporated by reference herein and made a part of this specification.

BACKGROUND OF THE INVENTION

1. Field of the Invention

The present invention relates to a wafer or chip structure, a stacked structure and methods for fabricating the same, and more particularly to a self-aligned wafer or chip structure, self-aligned stacked structure and methods for fabricating the same.

2. Description of Related Art

With the development of science and technology, more and more functions must be integrated in a single application carrier. The most common application carriers are mobile phones closely related to every individual and memory card elements for storing mass digital information. In addition, with the human's endless requirements for information bandwidth, more and more semiconductor devices are designed towards the trend of having a high frequency or ultra-high frequency, and thus the current wire bonding technique cannot satisfy the requirements of the above applications any more.

Recently, more and more constructions are designed as through silicon vias (TSV) with a high-density three-dimensional stacked structure and an ultra-short electrical wiring distance. For example, some US patents, such as U.S. Pat. Nos. 7,091,124 and 6,936,913, have proposed several structures and methods for stacking a plurality of chips together, which can greatly reduce the volume of the construction, increase the capacity of the construction, and significantly reduce the high parasitic inductance effect of the high frequency electrical signal between chips due to a long electrical connection length. However, how to precisely align and stack the chips together to ensure the well electrical connection between chips is one of the most important tasks. Moreover, in all those proposed stacking methods, one stacking process must be performed together with one reflow process, so as to complete the whole stacked construction. Therefore, the existed methods have the disadvantage of being quite time consuming.

SUMMARY OF THE INVENTION

The present invention is directed to a self-aligned wafer or chip structure, which has a self-alignment mechanism, and thus when stacking wafers or chips, the wafers or chips can be aligned and stacked precisely to ensure the well electrical connection between every two chips.

The present invention is further directed to a self-aligned stacked structure, in which each wafer or chip in the stacked structure has a self-alignment mechanism.

The present invention is further directed to a method for fabricating a self-aligned wafer or chip structure, capable of fabricating wafers or chip structures having self-alignment mechanism.

The present invention is further directed to a method for fabricating a self-aligned stacked structure, capable of solving the problem that the conventional stacked construction process is rather time consuming.

As embodied and broadly described herein, the present invention provides a self-aligned wafer or chip structure, which includes a substrate, at least one first concave base, at least one second concave base, at least one connecting structure and at least one bump. The substrate has a first surface and a second surface, and at least one pad is formed on the first surface. The first concave base is disposed on the first surface and electrically connected to the pad. The second concave base is disposed on the second surface. The connecting structure passes through the substrate and disposed between the first and second concave bases so as to be electrically connected to the first and second concave bases. The bump is disposed and filled in the second concave base, and protrudes out of the second surface.

The present invention further provides a self-aligned stacked structure, which includes a plurality of self-aligned wafers or chip structures stacked together, and each self-aligned wafer or chip structure includes a substrate, at least one first concave base, at least one second concave base, at least one connecting structure and at least one bump. The substrate has a first surface and a second surface, and at least one pad is formed on the first surface. The first concave base is disposed on the first surface and electrically connected to the pad. The second concave base is disposed on the second surface. The connecting structure passes through the substrate and disposed between the first and second concave bases, so as to be electrically connected to the first and second concave bases. The bump protrudes out of the second surface. Particularly, the bump of each self-aligned wafer or chip structure is engaged in the first concave base of the next self-aligned wafer or chip structure.

The present invention further provides a method for fabricating a self-aligned wafer or chip structure, which includes the following steps. First, a substrate is provided, which has a first surface and a second surface, and at least one pad is formed on the first surface of the substrate. Next, an opening is formed inwards from the first surface to an interior of the substrate, and a conductive material is filled in the opening to form a connecting structure that is electrically connected to the pad. Then, at least one first concave base is formed on the first surface, and electrically connected to the pad and the connecting structure. Then, at least one second concave base is formed on the second surface of the substrate, and electrically connected to the connecting structure. Afterwards, a bump is formed in the second concave base, and protrudes out of the second surface.

The present invention further provides a method for fabricating a self-aligned stacked structure, which includes the following steps. First, a plurality of self-aligned wafers or chip structures is provided, and each self-aligned wafer or chip structure is as that described above. Next, the self-aligned wafers or chip structures are sequentially stacked together, and the bump of each self-aligned wafer or chip structure is self-aligned with and engaged with the first concave base of the next self-aligned wafer or chip structure. Then, a single heating step is performed, such that the bump of each self-aligned wafer or chip structure is soldered with the first concave base of the next self-aligned wafer or chip structure.

In the present invention, since concave bases and corresponding bumps are disposed on the surfaces of the wafers or chips, when stacking the wafers or chips, the design of the concave base and the bump can be utilized to achieve the self-alignment effect. Moreover, in the present invention, after finishing the stacking of a plurality of wafers or chips, merely a single heating step is sufficient. Therefore, the method of the present invention has the advantages of being much faster and simpler compared with the method in the conventional art.

In order to make the aforementioned and other objects, features, and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute apart of this specification. The drawings illustrate embodiments of the invention and, together with the description, serve to explain the principles of the invention.

DESCRIPTION OF EMBODIMENTS

Figure 1A:
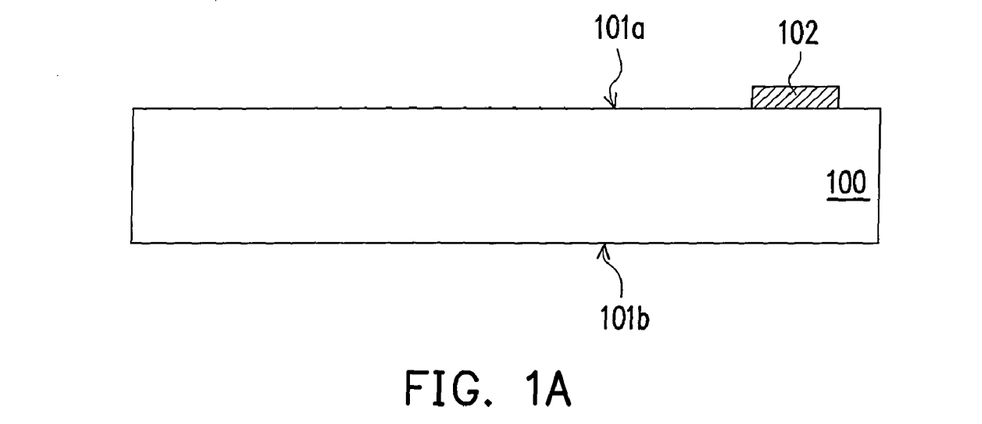
FIGS. 1A to 1I are schematic sectional views of a flow for fabricating a self-aligned wafer or chip structure according to an embodiment of the present invention.

FIGS. 1A to 1I are schematic sectional views of a flow for fabricating a self-aligned wafer or chip structure according to an embodiment of the present invention. Referring to FIG. 1A, a substrate 100 is provided first, which has a first surface 101a and a second surface 101b. The substrate 100 is, for example, a wafer or a chip, and has a plurality of elements and interconnect structures (not shown) formed therein. Particularly, at least one pad 102 is formed on the first surface 101a of the substrate 100, and the pad 102 is electrically connected to the elements and the interconnect structures within the substrate 100. The pad 102 is made of metal, for example. The pad 102 is formed by means of, for example, conventional deposition, photolithography, and etching techniques. In this embodiment, the pad 102 is the one disposed at the center of the wafer or chip.

Figure 1B:
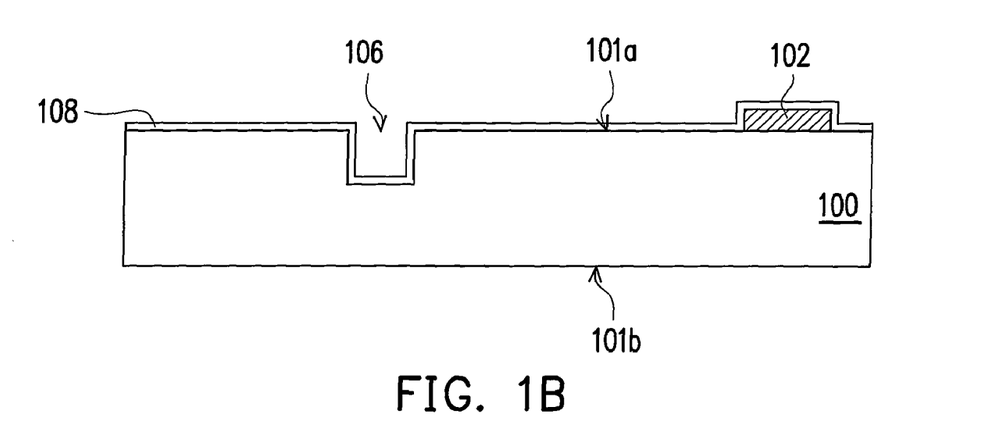

Next, referring to FIG. 1B, an opening 106 is formed inwards from the first surface 101a of the substrate 100 to the interior of the substrate 100, and the opening 106 does not pass through the substrate 100. The opening 106 can be formed through etching, laser, or another known suitable process. In an embodiment, after forming the opening 106, the method further includes performing a deposition process, so as to at least form an insulation layer 108a on the first surface 101a. Herein, if the insulation layer 108 is formed through a chemical vapor deposition (CVD) process, it is only deposited on the first surface 101a. If the insulation layer 108 is formed through a furnace deposition process, it is deposited on the first surface 101a and the second surface 101b. In the figure, the insulation layer 108 is merely formed on the first surface 101a for illustration.

Figure 1C:
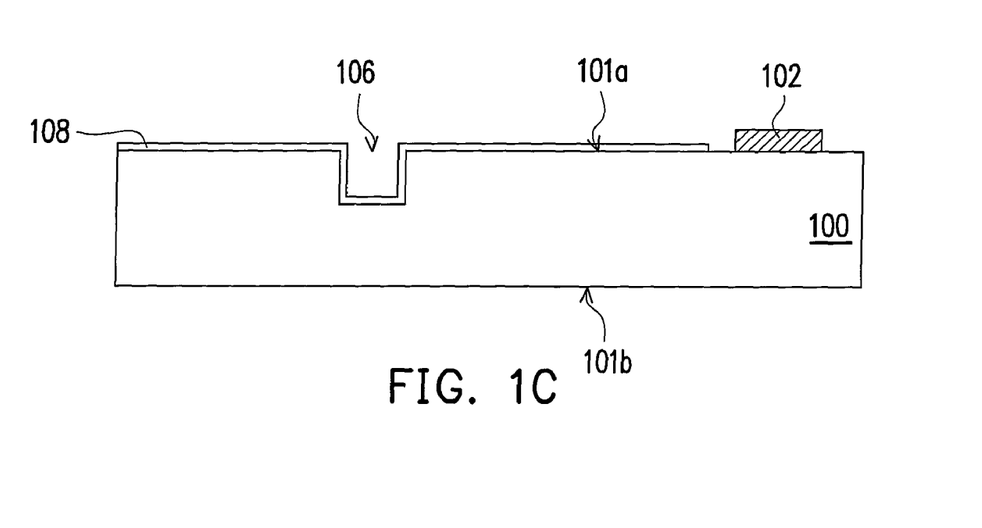

Referring to FIG. 1C, the insulation layer 108 on the pad 102 is removed, so as to expose the pad 102. The process for removing a portion of the insulation layer 108 is, for example, photolithography and etching processes.

Figure 1D:
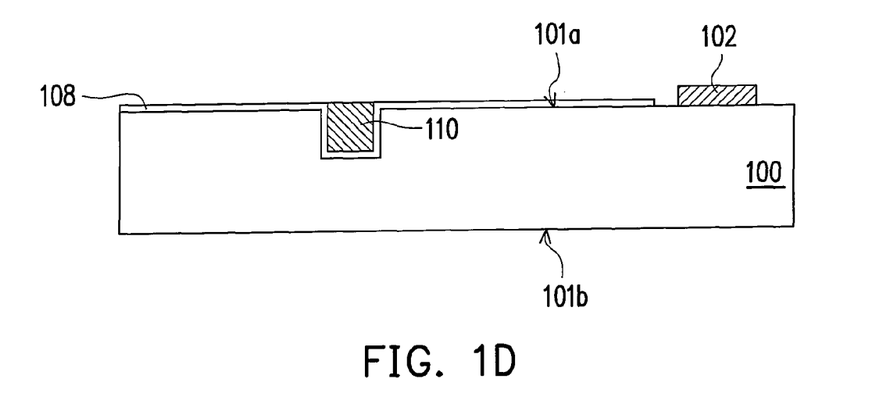

Referring to FIG. 1D, a conductive material is filled in the opening 106 to form a connecting structure 110. The connecting structure 110 is made of metal, e.g., copper, or polysilicon. The connecting structure 110 is formed by means of, for example, performing a deposition process to form a layer of conductive material on the substrate 100 and filling the opening 106, and removing a portion of the conductive material by means of etching back, chemical mechanical polishing (CMP) or another suitable method, thereby maintaining the conductive material in the opening 106.

Figure 1E:
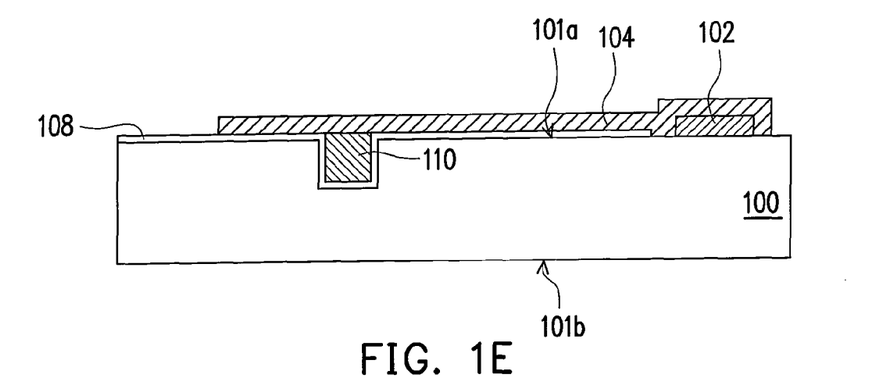

After forming the connecting structure 110, an extension lead 104 is further formed on the first surface 101a of the substrate 100, and electrically connected to the pad 102 and the connecting structure 110, as shown in FIG. 1E. In this embodiment, the pad 102 is disposed at the center of the wafer or chip, such that the formation of the extension lead 104 enables the subsequently-formed concave base structure to be disposed at edges of the wafer or chip. The extension lead 104 can be formed through any known process, for example, deposition, photolithography and etching techniques.

It should be noted that, the figures of this embodiment only shows one pad and one extension lead, and in practice, the substrate (wafer or chip) may include a plurality of pads and a plurality of corresponding extension leads.

Figure 1F:
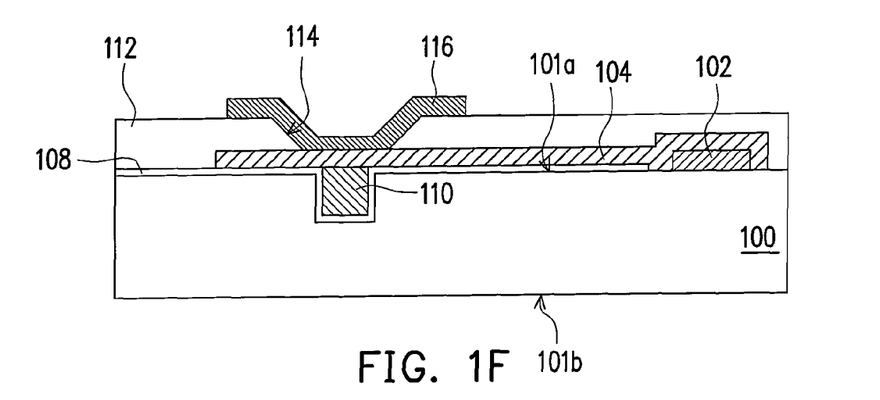

Referring to FIG. 1F, at least one first concave base 116 is formed on the first surface 101a, and electrically connected to the pad 102 and the connecting structure 110. In this embodiment, the first concave base 116 is electrically connected to the pad 102 and the connecting structure 110 through the extension lead 104. The first concave base 116 is formed by means of, for example, forming a passivation layer 112 on the first surface 101a, and the passivation layer 112 has a recess pattern 114 therein. The recess pattern 114 is formed by means of, for example, performing a photolithography and etching process on the passivation layer 112. Then, a conductive layer is formed in the recess pattern 114 to form the first concave base 116. The conductive layer includes, for example, a seed layer and under bump metallurgic layers.

Figure 1G:
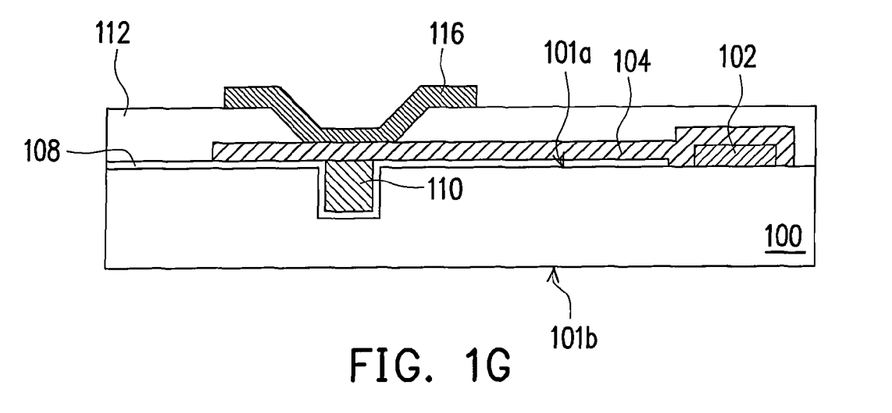

After finishing the fabrication of the first concave base 116, a substrate thinning step is preferably performed on the second surface 101b of the substrate 100, as shown in FIG. 1G, so as to make the substrate 100 become thinner. The substrate thinning step is performed through, for example, a grinding process and a plasma treatment process.

Figure 1H:
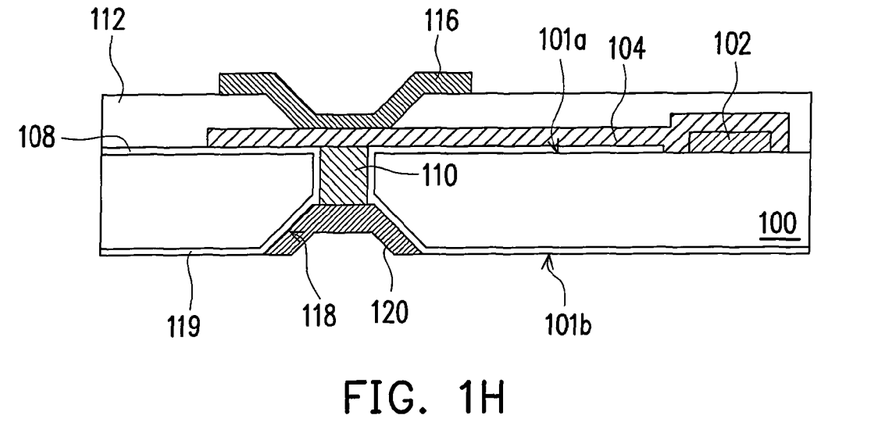

Referring to FIG. 1H, a second concave base 120 is formed on the second surface 101b of the substrate 100. The second concave base 120 is formed by means of, for example, forming a recess pattern 118 on the second surface 101b of the substrate 100, and then forming a conductive layer in the recess pattern 118, so as to form the second concave base 120. The recess pattern 118 is formed through, for example, performing a wet etching process or a dry etching process on the substrate 100. Similarly, the conductive layer includes, for example, a seed layer and under bump metallurgic layers.

Moreover, in another embodiment, before forming the conductive layer in the recess pattern 118, the method further includes a deposition step, so as to form an insulation layer 119 on the second surface 101b. Then, a portion of the insulation layer 119 is removed to expose the connecting structure 110.

Figure 1I:
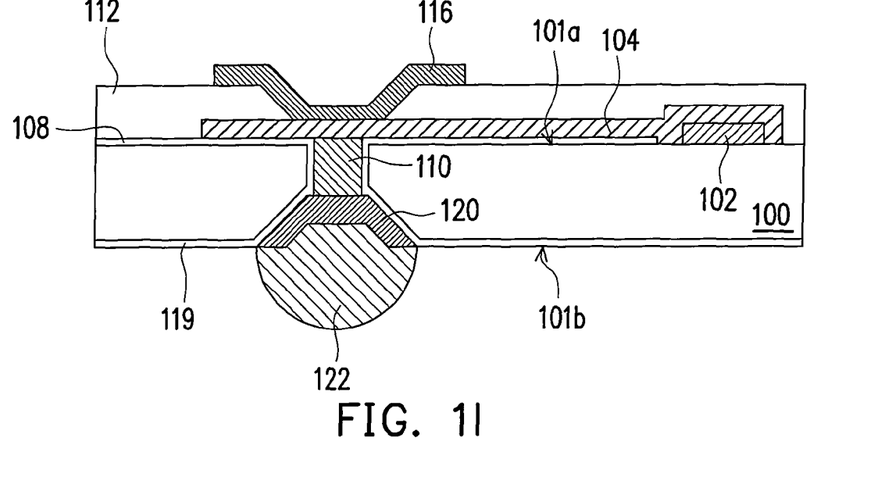

Referring to FIG. 1I, a bump 122 is formed in the second concave base 120, and protrudes out of the second surface 101b. Therefore, the self-aligned wafer or chip structure of the present invention is finished. Herein, the bump 122 can be formed through any known method. The bump 122 can be made of any material that has already been used in bump or solder ball.

Therefore, as shown in FIG. 1H, the self-aligned wafer or chip structure formed through the above method includes a substrate 100, at least one first concave base 116, at least one second concave base 120, at least one connecting structure 110 and at least one bump 122.

The substrate 100 has a first surface 101a and a second surface 101b opposite to the first surface, and at least one pad 102 is formed on the first surface 101a. In an embodiment, the first surface 101a further includes an extension lead 104 disposed thereon, and the extension lead 104 is electrically connected to the pad 102.

In addition, the first concave base 116 is disposed on the first surface 101a, and electrically connected to the pad 102. In an embodiment, the first concave base 116 is electrically connected to the pad 102 through the extension lead 104.

Moreover, the second concave base 120 is disposed on the second surface 101b. The connecting structure 110 passes through the substrate 100 and disposed between the first concave base 116 and the second concave base 120, so as to be electrically connected to the first concave base 116 and the second concave base 120. In other words, the connecting structure 110 is used for electrically connecting the first concave base 116 and the second concave base 120. In addition, the bump 122 is filled in the second concave base 120, and protrudes out of the second surface 101b.

In an embodiment, the structure further includes a passivation layer 112 disposed on the first surface 101a and covering the pad 102. The first concave base 116 is disposed on the passivation layer 112. In another embodiment, the structure further includes insulation layers 108 and 119, and the insulation layer 108 is disposed on the first surface 101a of the substrate 100, and located on a side wall of the connecting structure 110. The insulation layer 119 is disposed on the second surface 101b and connected to the insulation layer 108. The second concave base 120 is disposed on the insulation layer 119.

Figure 3:
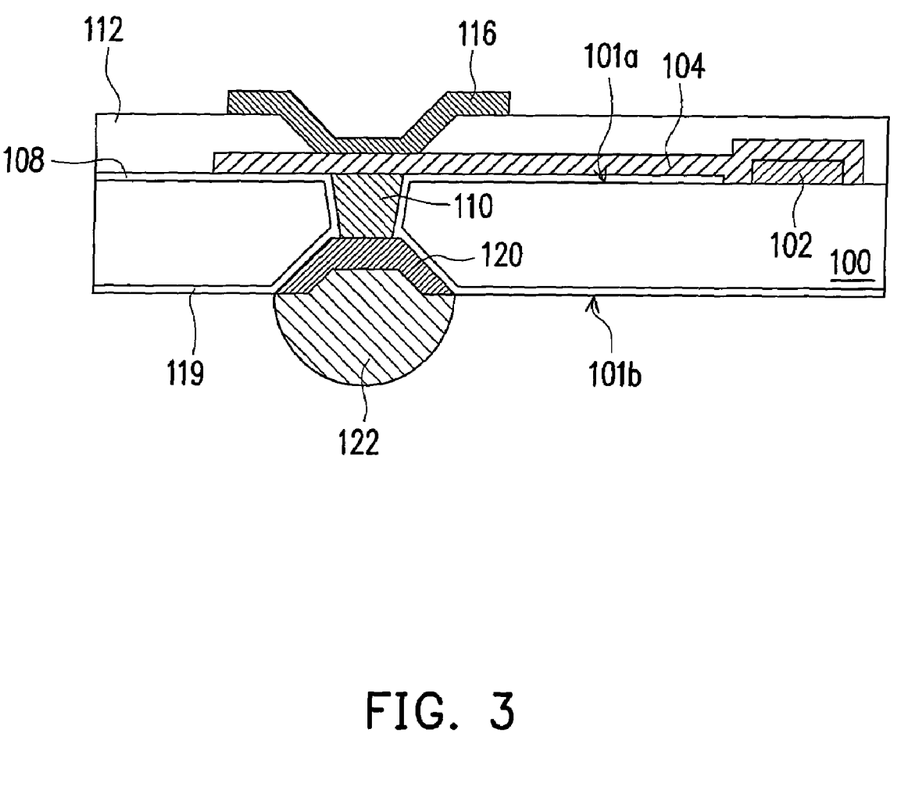
FIG. 3 is a schematic sectional view of the self-aligned wafer or chip structure according to an embodiment of the present invention.
Figure 4A:
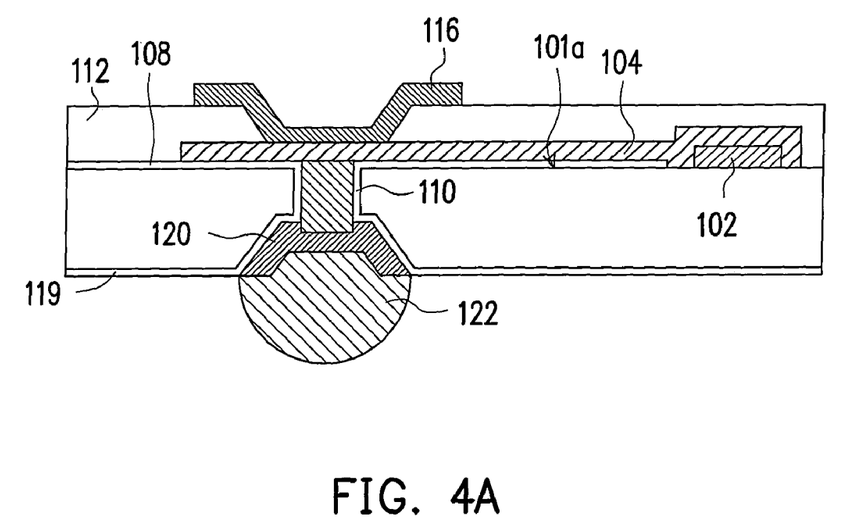
FIGS. 4A and 4B are schematic sectional views of the self-aligned wafer or chip structure according to an embodiment of the present invention.
Figure 4B:
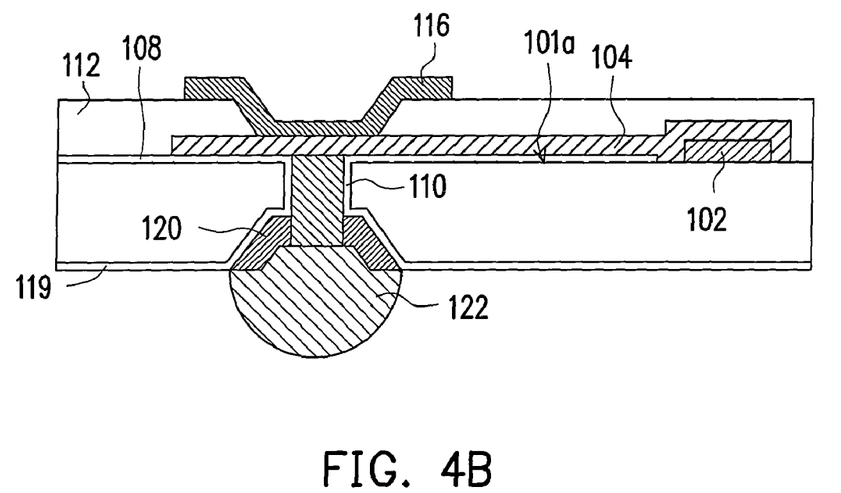
Figure 5A:
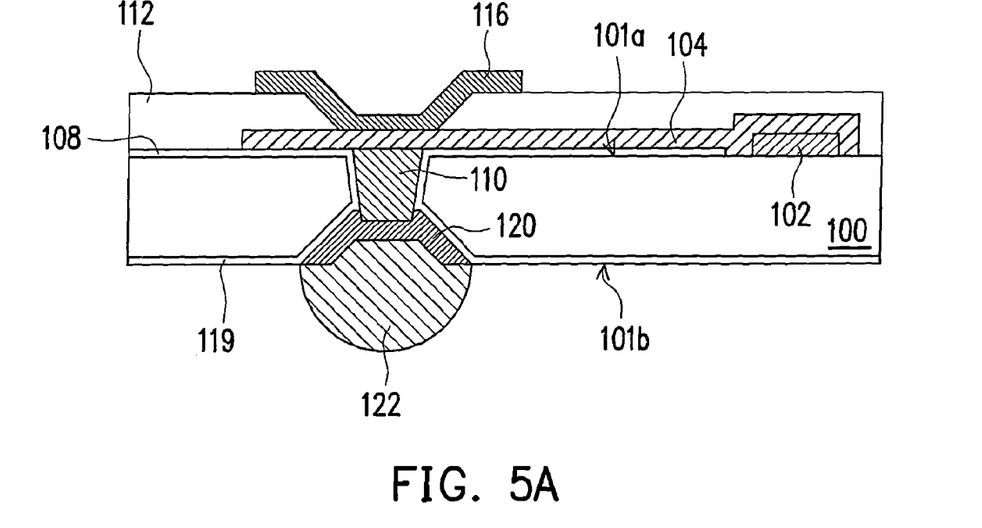
FIGS. 5A and 5B are schematic sectional views of the self-aligned wafer or chip structure according to an embodiment of the present invention.
Figure 5B:
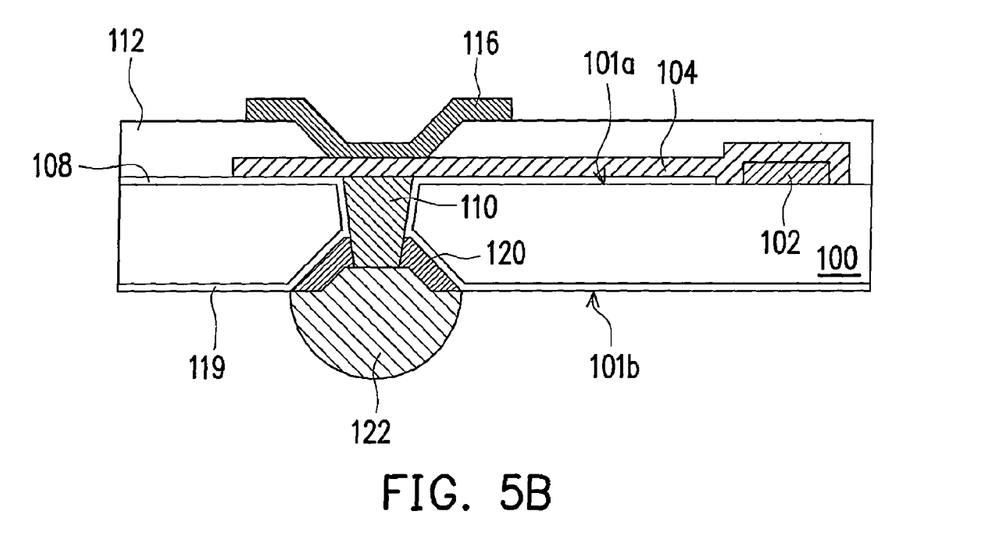

A longitudinal section of the connecting structure 110 in the wafer or chip structure (as shown in FIG. 1I) is rectangular shaped, but the present invention is not limited to this. In another embodiment, the longitudinal section of the connecting structure 110 is trapezoidal-shaped, as shown in FIG. 3. Moreover, the connecting structure 110 shown in FIG. 1I is in planar contact with the bottom of the second concave base 120. But the present invention is not limited to this. In another embodiment, the connecting structure 110 may partially pass through the second concave base 120 (as shown in FIG. 4A), or passes through the second concave base 120 (as shown in FIG. 4B) to be in direct contact with the bump 122. In still another embodiment, the structure of the chip or wafer of the present invention can also be a combination of the structure features of FIGS. 3 and 4A, i.e., the longitudinal section of the connecting structure 110 is trapezoidal-shaped and the connecting structure 110 partially passes through the second concave base 120, as shown in FIG. 5A. Moreover, in yet another embodiment, the structure of the chip or wafer of the present invention can also be a combination of the structure features of FIGS. 3 and 4B, i.e., the longitudinal section of the connecting structure 110 is trapezoidal-shaped, and the connecting structure 110 passes through the second concave base 120, so as to be in direct contact with the bump 122, as shown in FIG. 5B.

The wafer or chip structure formed through above method has the concave base 116 and the bump 122, and with the concave base 116 and the bump 122, two wafers or chips can be aligned with each other when being overlapped or stacked, thereby achieving the self-alignment effect. The method for forming a self-aligned stacked structure by stacking a plurality of wafers or chips is illustrated below.

Figure 2A:
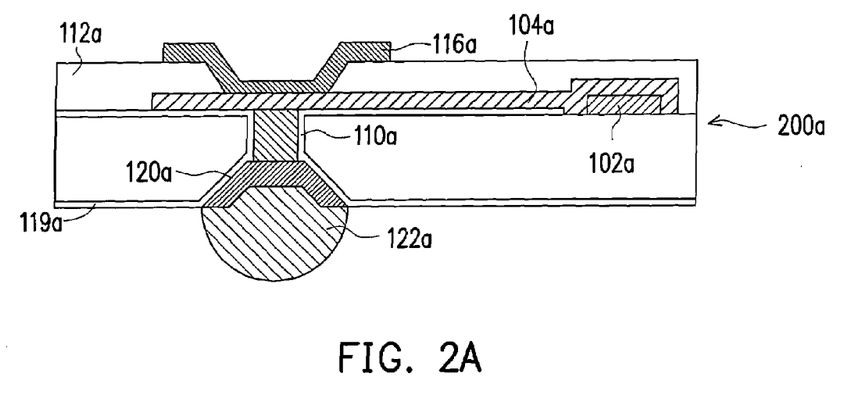
FIGS. 2A to 2C are schematic sectional views of a flow for fabricating a self-aligned stacked structure according to an embodiment of the present invention.
Figure 2B:
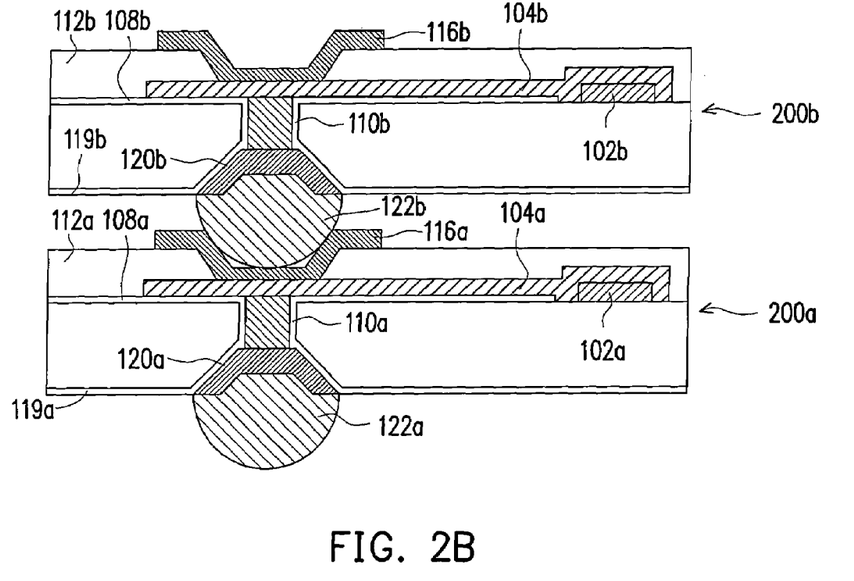
Figure 2C:
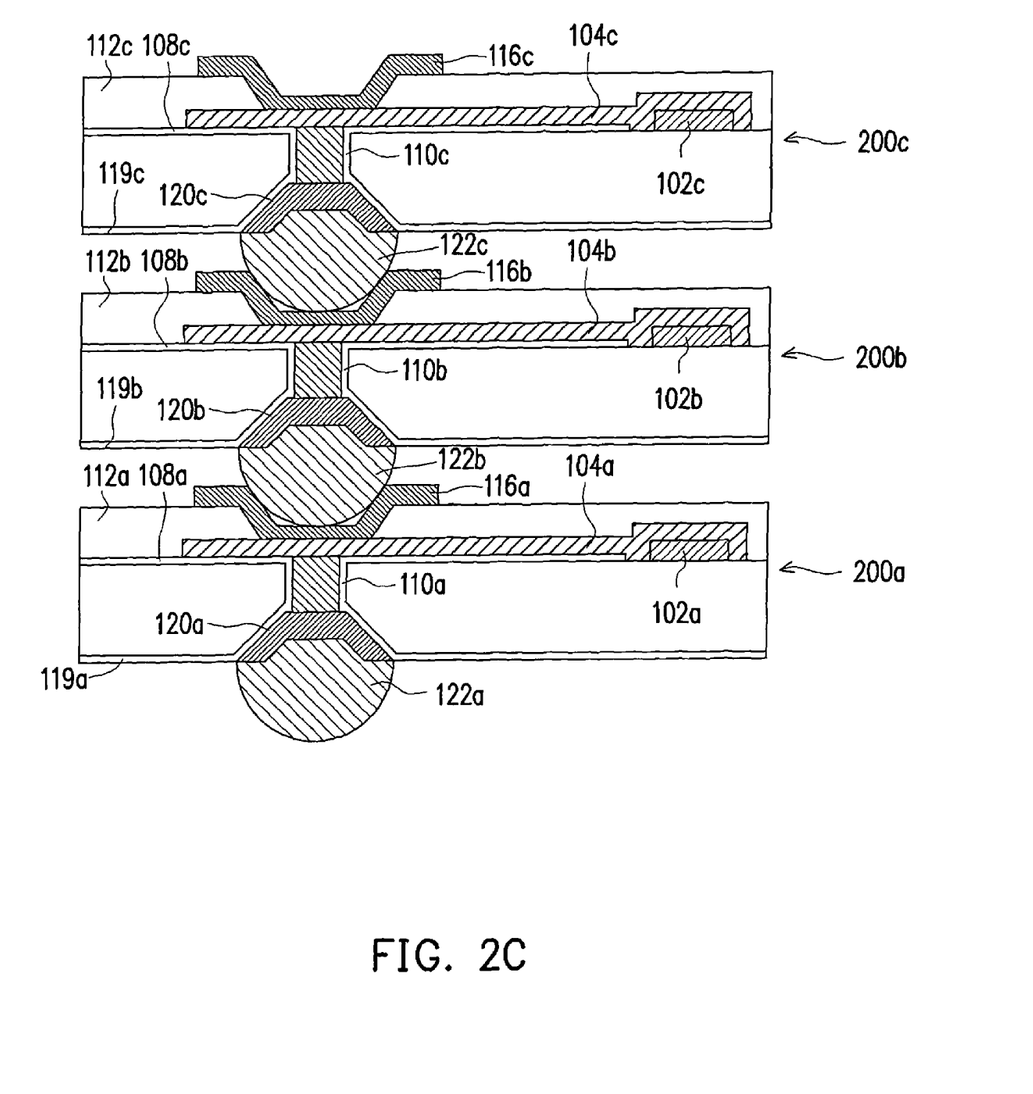

FIGS. 2A to 2C are schematic sectional views of a flow for fabricating a self-aligned stacked structure according to an embodiment of the present invention. Referring to FIG. 2A first, a wafer or chip structure 200a is provided, which is fabricated through the method shown in FIGS. 1A to 1I, so the components for the wafer or chip structure 200a are identical or similar to the components for the structure shown in FIG. 1I, and the same elements in the two figures (FIGS. 1I and 2A) are marked by the same or similar numerals.

Referring to FIG. 2B, a second wafer or chip 200b is provided, and the second wafer or chip 200b is stacked on the first wafer or chip 200a. The components for the second wafer or chip 200b are identical or similar to the components for the structure shown in FIG. 1I, and the same elements in the two figures (FIGS. 1I and 2B) are marked by the same or similar numerals. Particularly, when stacking the second wafer or chip 200b on the first wafer or chip 200a, the concave base 116a on the first wafer or chip 200a is engaged with the bump 122b on the second wafer or chip 200b, such that the self-alignment effect is achieved.

Referring to FIG. 2C, a third wafer or chip 200c is provided, and the third wafer or chip 200c is stacked on the second wafer or chip 200b. The components for the third wafer or chip 200c are identical or similar to the components for the structure shown in FIG. 1I, and the same elements in the two figures (FIGS. 1I and 2C) are marked by the same or similar numerals. Similarly, when stacking the third wafer or chip 200c on the second wafer or chip 200b, the concave base 116b on the second wafer or chip 200b is engaged with the bump 122c on the third wafer or chip 200c, such that the self-alignment effect is achieved.

After finishing the stacking of a plurality of wafers or chips, a single heating step is performed, such that the bump 122b on the second wafer or chip 200b is soldered with the concave base 116a on the first wafer or chip, and meanwhile, the bump 122c on the third wafer or chip 200c is soldered with the concave base 116b on the second wafer or chip.

The above description is made by taking the process of stacking three wafers or chips as an example, but the present invention is not limited to this. The present invention can stack more than three wafers or chips according to the actual requirements. In the present invention, after stacking a plurality of wafers or chips, only a single heating step is required to solder the wafers or chips together, and thus, the method of the present invention is much faster and simpler compared with the method of the conventional art.

The self-aligned stacked structure formed through the above method is shown in FIG. 2C, which includes a plurality of self-aligned wafers or chip structures 200a, 200b, 200c stacked together, and each self-aligned wafer or chip structure 200a, 200b, 200c has the structure shown in FIG. 1I, so the components for the self-aligned wafer or chip structure 200a, 200b, 200c are not repeatedly described any more. Particularly, the concave base 116a on the first wafer or chip 200a is engaged with the bump 122b on the second wafer or chip 200b, and the concave base 116b on the second wafer or chip 200b is engaged with the bump 122c on the third wafer or chip 200c, such that the self-alignment effect is achieved.

Figure 6:
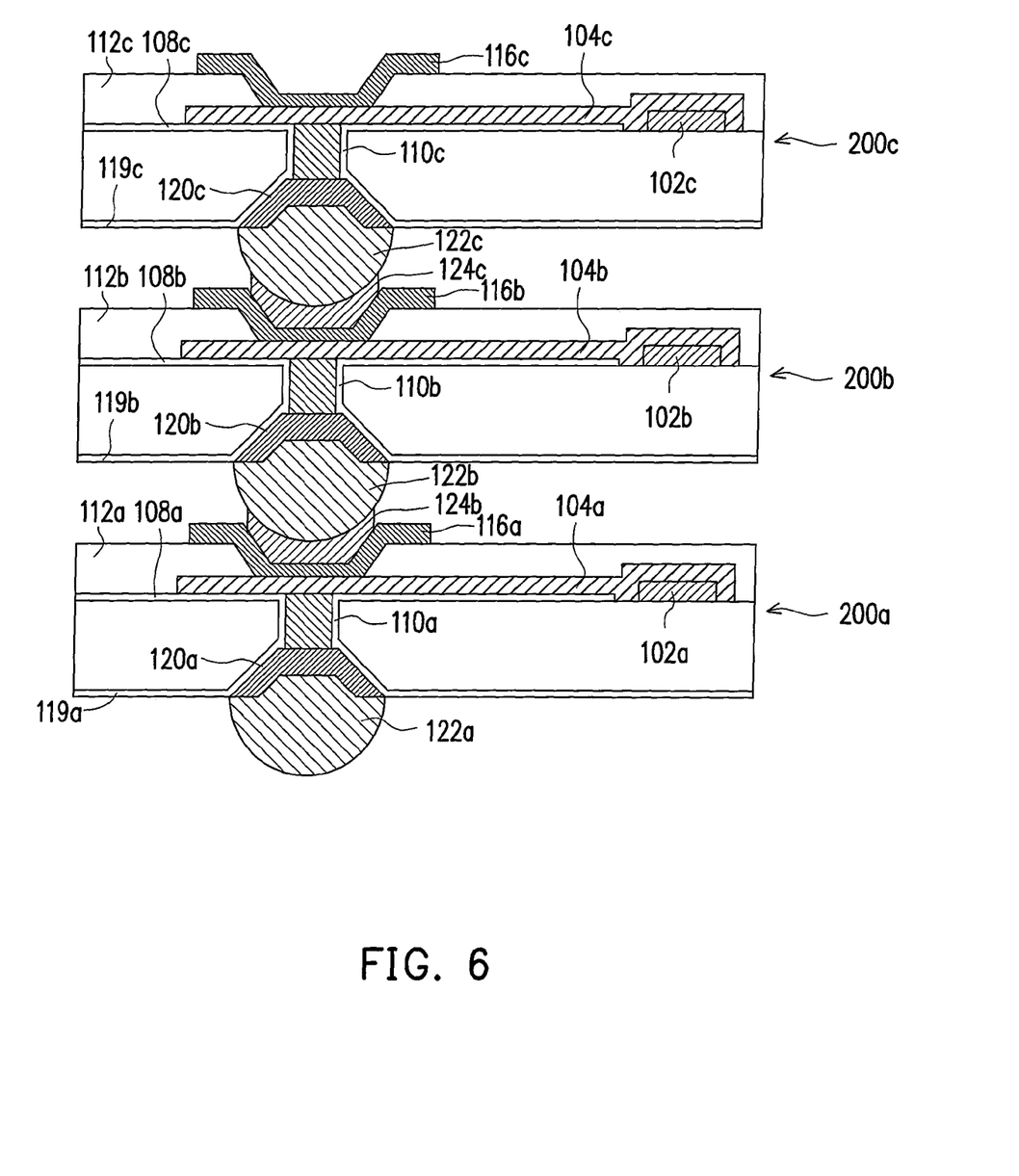
FIG. 6 is a schematic sectional view of the self-aligned stacked structure according to an embodiment of the present invention.

Moreover, in another embodiment, as shown in FIG. 6, before stacking the second wafer or chip 200b on the first wafer or chip 200a, the method further includes attaching a solder paste 124b on the bump 122b of the second wafer or chip 200b. Similarly, before stacking the third wafer or chip 200c on the second wafer or chip 200b, the method further includes attaching a solder paste 124c on the bump 122c of the third wafer or chip 200c. Thereafter, when performing the subsequent single heating step, the solder paste 124b, 124c assists or promotes the soldering action between the bump and the concave base (between the bump 122b and the concave base 116a and between the bump 122c and the concave base 116b).

In the above embodiment, the structure formed with the pad located at the center of the wafer or chip is taken as an example. If the pad itself is originally located at the edge of the chip or wafer, the extension lead can be omitted, and the concave base and the connecting structure can be directly formed on the pad, the detailed illustration is given below.

Figure 7A:
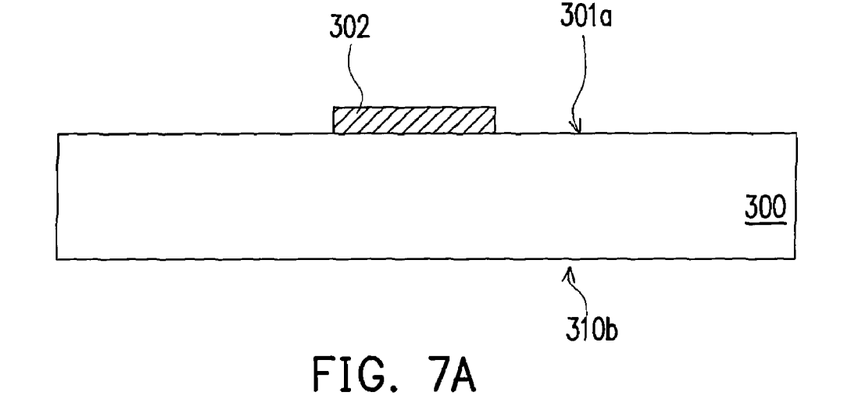
FIGS. 7A to 7H are schematic sectional views of a flow for fabricating a self-aligned wafer or chip structure according to another embodiment of the present invention.

FIGS. 7A to 7H are schematic sectional views of a flow for fabricating a self-aligned wafer or chip structure according to another embodiment of the present invention. The same or similar elements in FIGS. 7A to 7H and in FIGS. 1A to 1I are marked by similar numerals. Referring to FIG. 7A, a substrate 300 is provided, which has a first surface 301a and a second surface 301b. The substrate 300 is, for example, identical or similar to the substrate 100 in FIG. 1A. At least one pad 302 is formed on the first surface 301a of the substrate 300. Particularly, the pad 302 is located at the edge of the chip or wafer.

Figure 7B:
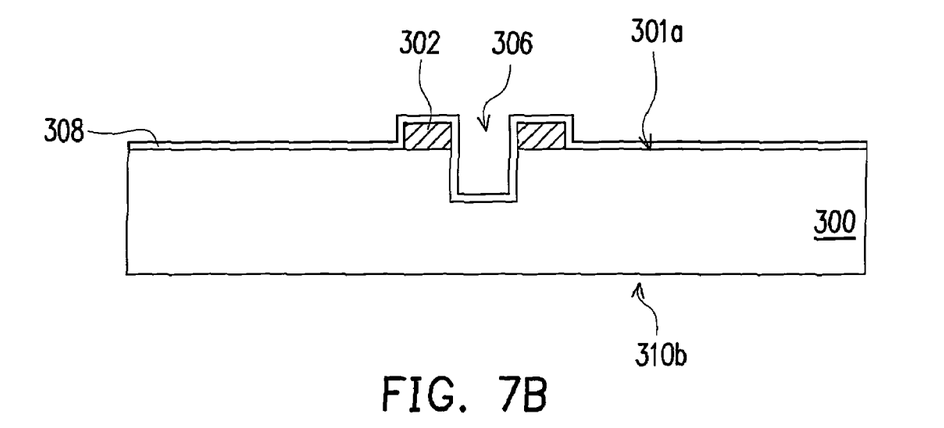

Referring to FIG. 7B, an opening 306 is formed inwards from a position on the substrate 300, where the pad 302 is formed, towards the interior of the substrate 300, and the opening 306 does not pass through the substrate 300. In an embodiment, after the opening 306 is formed, the method further includes a deposition process, so as to at least form an insulation layer 308 on the first surface 301a. Herein, if the insulation layer 308 is formed through the CVD process, it is only deposited on the first surface 301a. If the insulation layer 308 is formed through the furnace deposition process, it is deposited on the first surface 301a and the second surface 301b. In the figure, the insulation layer 308 is, for example, only formed on the first surface 301a.

Figure 7C:
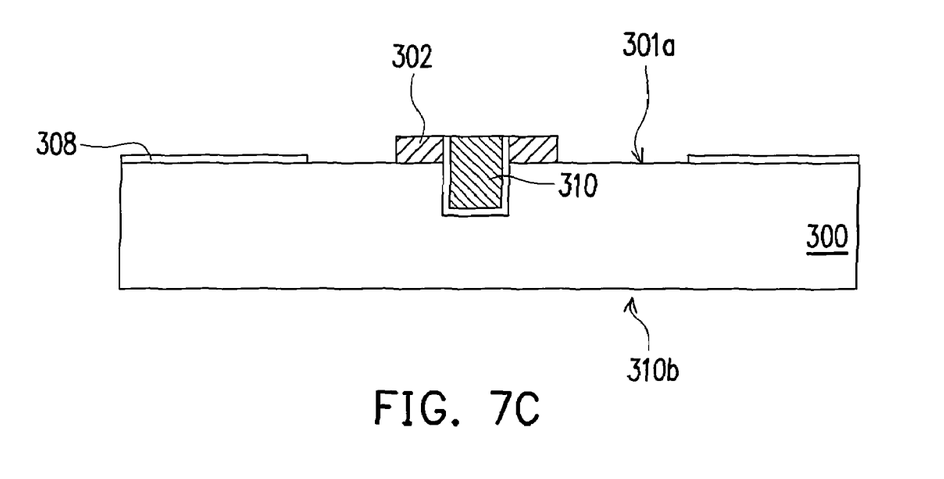

Referring to FIG. 7C, a conductive material is filled in the opening 306 to form a connecting structure 310. Then, the insulation layer 308 on the pad 302 is removed to expose the pad 302.

Figure 7D:
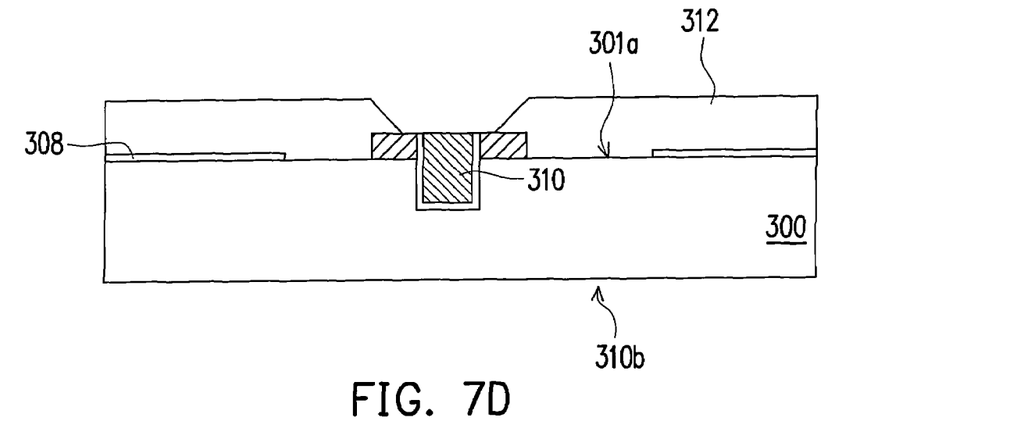
Figure 7E:
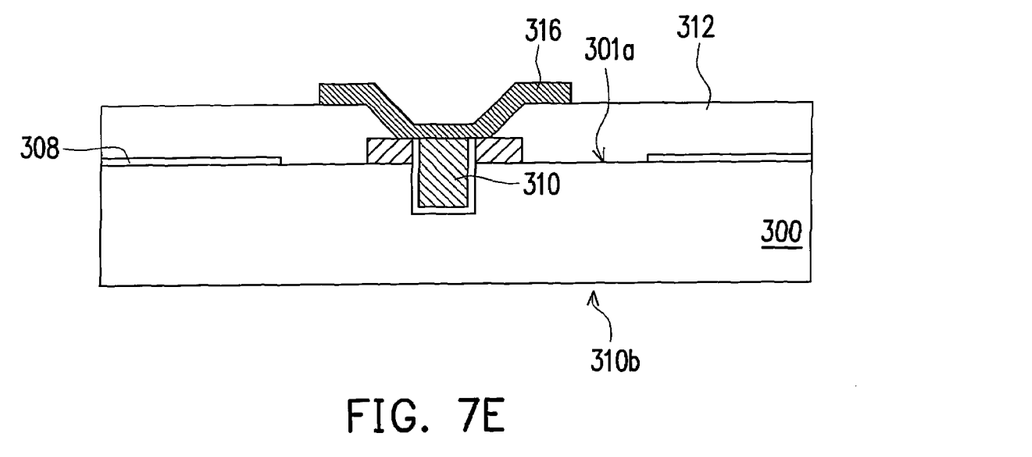

Referring to FIGS. 7D and 7E, a passivation layer 312 and at least one first concave base 316 are formed on the first surface 301a, and the first concave base 316 is electrically connected to the pad 302 and the connecting structure 310.

Figure 7F:
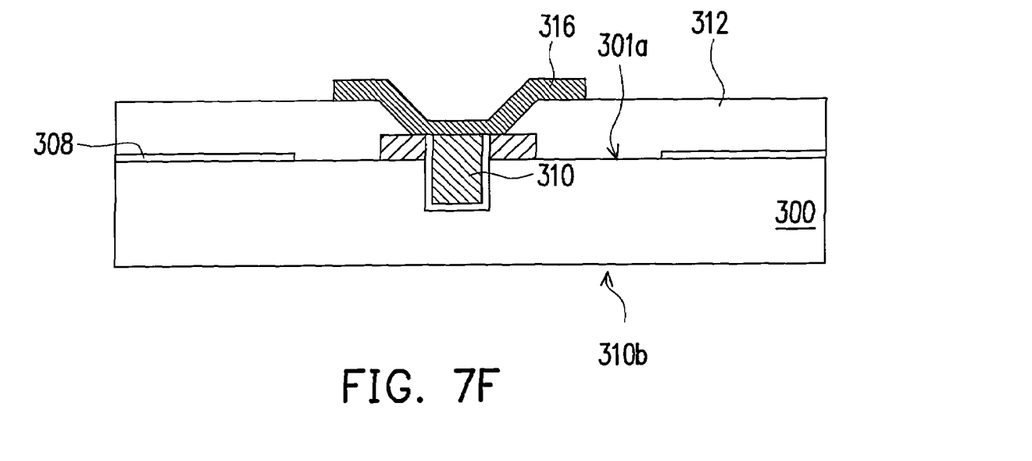

After finishing the fabrication of the first concave base 316, a substrate thinning step is preferably performed on the second surface 301b of the substrate 300, as shown in FIG. 7F, so as to make the substrate 300 become thinner.

Figure 7G:
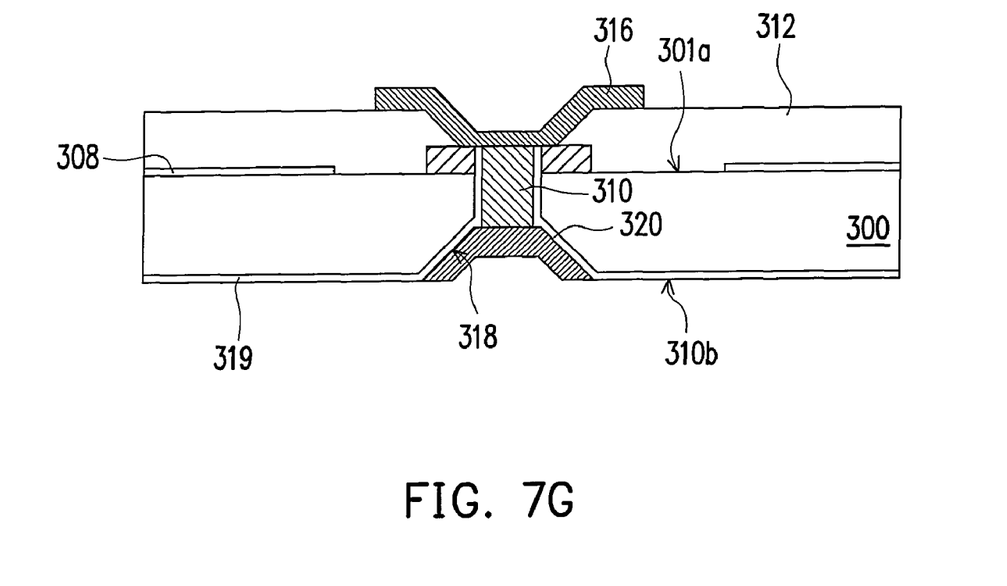

Referring to FIG. 7G, a second concave base 320 is formed on the second surface 301b of the substrate 300. The second concave base 320 is formed by means of, for example, forming a recess pattern 318 on the second surface 301b of the substrate 300, and then forming a conductive layer 320 in the recess pattern 318, so as to form the second concave base 320. In another embodiment, before forming the conductive layer 320 in the recess pattern 318, the method further includes a deposition step, so as to form an insulation layer 319 on the second surface 301b. Then, a portion of the insulation layer 319 is removed to expose the connecting structure 310.

Figure 7H:
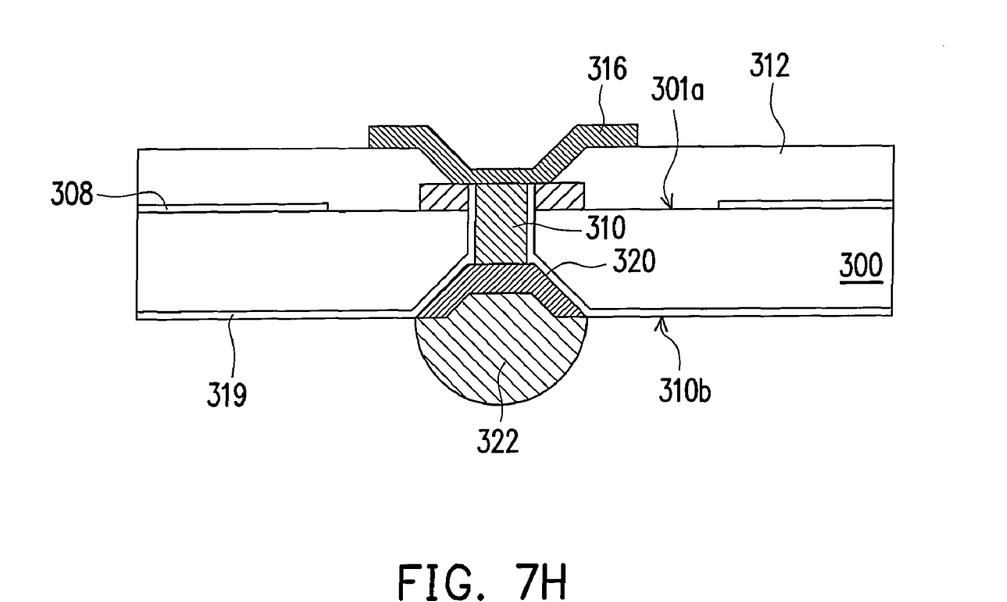

Referring to FIG. 7H, a bump 322 is formed in the second concave base 320, and the self-aligned wafer or chip structure is finished. Therefore, if the pad on the wafer or chip is located at the edge of the wafer or chip, structures such as the connecting structure and the concave base can be directly formed on the pad.

Similarly, a longitudinal section of the connecting structure 310 in the wafer or chip structure shown in FIG. 7H is rectangular or trapezoidal-shaped (similar to the connecting structure shown in FIG. 3). Moreover, the connecting structure 310 shown in FIG. 7H can partially pass through or pass through the second concave base 320 (similar to the connecting structure shown in FIGS. 4A and 4B). Definitely, the longitudinal section of the connecting structure 310 shown in FIG. 7H can also be trapezoidal-shaped, and the connecting structure 310 further partially passes through or passes through the second concave base 320 (similar to the connecting structure shown in FIGS. 5A and 5B).

Moreover, the wafer or chip structure formed through the method as described in FIGS. 7A to 7H can also be used to from the self-aligned stacked structure by means of utilizing the stacking method as described in FIGS. 2A to 2C (or FIG. 6).

To sum up, since the present invention has concave bases and corresponding bumps disposed on the surfaces of the wafers or chips, when stacking the wafers or chips, the design of concave bases and bumps can be utilized to achieve the self-alignment effect. Moreover, in the present invention, after finishing the stacking of a plurality of wafers or chips, merely a single heating step is sufficient. Therefore, the method of the present invention has the advantages of being much faster and simpler compared with the method of the conventional art.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A self-aligned wafer or chip structure, comprising:
   a substrate, having a first surface and a second surface, wherein at least one pad is formed on the first surface;
   at least one first concave base, disposed on the first surface, and electrically connected to the pad;
   at least one second concave base, disposed on the second surface and embedded in the substrate, and the second concave base has a top surface co-planar with the second surface of the substrate;
   at least one connecting structure, passing through the substrate and disposed between the first and second concave bases, and electrically connected to the first and second concave bases; and
   at least one bump, filled in the second concave base, and protruding out of the second surface.

2. The self-aligned wafer or chip structure as claimed in claim 1, wherein the connecting structure further passes through or partially passes through the second concave base.

3. The self-aligned wafer or chip structure as claimed in claim 1, wherein a longitudinal section of the connecting structure is rectangular or trapezoidal.

4. The self-aligned wafer or chip structure as claimed in claim 1, further comprising a passivation layer, disposed on the first surface and covering the pad, wherein the first concave base is disposed on the passivation layer.

5. The self-aligned wafer or chip structure as claimed in claim 1, wherein the first concave base is in direct contact with the pad.

6. The self-aligned wafer or chip structure as claimed in claim 1, further comprising an extension lead, disposed on the first surface, wherein the extension lead is disposed between the pad and the first concave base, and electrically connected to the pad, the connecting structure and the first concave base.

7. The self-aligned wafer or chip structure as claimed in claim 1, wherein the first concave base on the first surface of the substrate and the second concave base on the second surface of the substrate are disposed at the same vertical axis.

8. The self-aligned wafer or chip structure as claimed in claim 1, further comprising:
   an extension lead, disposed on the first surface and covering the pad, so as to contact with the pad;
   a passivation layer, disposed on the first surface and covering the extension lead, wherein the passivation layer has a recess pattern exposing a portion of the extension lead, and the first concave base is disposed in recess pattern of the passivation layer and contacts with the exposed extension lead.

9. A self-aligned stacked structure, comprising:
   a plurality of self-aligned wafer or chip structures stacked together, each self-aligned wafer or chip structure comprising:
      a substrate, having a first surface and a second surface, wherein at least one pad is formed on the first surface;
      at least one first concave base, disposed on the first surface, and electrically connected to the pad;
      at least one second concave base, disposed on the second surface and embedded in the substrate, and the second concave base has a top surface co-planar with the second surface of the substrate;
      at least one connecting structure, passing through the substrate and disposed between the first and second concave bases, and electrically connected to the first and second concave bases; and
      at least one bump, filled in the second concave base, and protruding out of the second surface,
   wherein the bump of each self-aligned wafer or chip structure is engaged in the first concave base of the next self-aligned wafer or chip structure.

10. The self-aligned stacked structure as claimed in claim 9, wherein the connecting structure of the self-aligned wafer or chip structure further passes through or partially passes through the second concave base.

11. The self-aligned stacked structure as claimed in claim 9, wherein a longitudinal section of the connecting structure of the self-aligned wafer or chip structure is rectangular or trapezoidal.

12. The self-aligned stacked structure as claimed in claim 9, wherein each of the self-aligned wafer or chip structures further comprises a passivation layer disposed on the first surface and covering the pad, and the first concave base is disposed on the passivation layer.

13. The self-aligned stacked structure as claimed in claim 9, wherein in each self-aligned wafer or chip structure, the first concave base on the first surface of the substrate and the second concave base on the second surface of the substrate are disposed at the same vertical axis.

14. The self-aligned stacked structure as claimed in claim 9, wherein configurations of the plurality of self-aligned wafer or chip structures are the same, such that the first concave bases of the plurality of self-aligned wafer or chip structures and the second concave bases of the plurality of self-aligned wafer or chip structures are at the same vertical axis.

15. The self-aligned stacked structure as claimed in claim 9, wherein each self-aligned wafer or chip structure comprises:
   an extension lead, disposed on the first surface and covering the pad, so as to contact with the pad;
   a passivation layer, disposed on the first surface and covering the extension lead, wherein the passivation layer has a recess pattern exposing a portion of the extension lead, and the first concave base is disposed in recess pattern of the passivation layer and contacts with the exposed extension lead.

\* \* \* \* \*